(12) United States Patent
Park et al.

(10) Patent No.: US 9,190,163 B2
(45) Date of Patent: Nov. 17, 2015

(54) OPERATING METHOD OF NONVOLATILE MEMORY DEVICE AND OPERATING METHOD OF MEMORY CONTROLLER CONTROLLING THE NONVOLATILE MEMORY DEVICE

(71) Applicant: Samsung Electronics Co., Ltd., Suwon-Si, Gyeonggi-Do (KR)

(72) Inventors: Hai-Seok Park, Suwon-si (KR); Boh-Chang Kim, Yongin-si (KR); Hyung Suk Kim, Hwaseong-si (KR); Kiwhan Song, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/328,913

(22) Filed: Jul. 11, 2014

(65) Prior Publication Data
US 2015/0036431 A1 Feb. 5, 2015

(30) Foreign Application Priority Data

Jul. 30, 2013 (KR) ........................ 10-2013-0090269

(51) Int. Cl.
*G11C 16/26* (2006.01)
*G11C 16/34* (2006.01)

(52) U.S. Cl.
CPC ...................................... *G11C 16/26* (2013.01)

(58) Field of Classification Search
CPC ............... G11C 16/0483; G11C 16/10; G11C 11/5628; G11C 11/5642; G11C 16/26; G11C 16/3418; G11C 16/06; G11C 16/04; G11C 16/28; G11C 16/22; G11C 16/32; G11C 16/34
See application file for complete search history.

(56) References Cited

U.S. PATENT DOCUMENTS

| | | | |
|---|---|---|---|
| 5,970,022 A | 10/1999 | Hoang | |
| 7,426,137 B2 | 9/2008 | Hemink | |
| 7,808,831 B2 | 10/2010 | Mokhlesi et al. | |
| 7,876,620 B2 | 1/2011 | Mokhlesi et al. | |
| 7,974,139 B2 | 7/2011 | Kim et al. | |
| 8,149,624 B1 | 4/2012 | Hung et al. | |
| 8,472,266 B2 | 6/2013 | Khandelwal et al. | |
| 2003/0137873 A1 | 7/2003 | Kawamura | |
| 2007/0242509 A1 | 10/2007 | Hemink | |
| 2009/0052257 A1 | 2/2009 | Park et al. | |
| 2009/0138652 A1 | 5/2009 | Kim et al. | |

(Continued)

FOREIGN PATENT DOCUMENTS

| | | |
|---|---|---|
| JP | 2003217288 A | 7/2003 |
| KR | 100877103 B1 | 1/2009 |

(Continued)

*Primary Examiner* — Hien Nguyen
(74) *Attorney, Agent, or Firm* — Harness, Dickey & Pierce, P.L.C.

(57) ABSTRACT

An operating method of a memory controller controlling a nonvolatile memory device including a plurality of pages includes receiving a read request and a logical address from an additional device; determining a program state of an upper unselected word line of a selected word line corresponding to the received logical address; and transmitting a physical address corresponding to the logical address, state information, and a read command to the nonvolatile memory device according to a result of the determination in response to the read request, wherein the state information indicates a level of a first unselect read voltage the nonvolatile memory device is to apply to the upper unselected word line.

20 Claims, 14 Drawing Sheets

(56) References Cited

U.S. PATENT DOCUMENTS

| | | |
|---|---|---|
| 2009/0323412 A1 | 12/2009 | Mokhlesi et al. |
| 2010/0271874 A1 | 10/2010 | Mokhlesi et al. |
| 2010/0296350 A1 | 11/2010 | Kim et al. |
| 2011/0292726 A1 | 12/2011 | Lee et al. |
| 2012/0063232 A1 | 3/2012 | Hung et al. |
| 2012/0250414 A1 | 10/2012 | Khandelwal et al. |

FOREIGN PATENT DOCUMENTS

| | | |
|---|---|---|
| KR | 20090007054 A | 1/2009 |
| KR | 20090055314 A | 6/2009 |
| KR | 20100124892 A | 11/2010 |
| KR | 2011-0038083 A | 4/2011 |
| KR | 2011-0132072 A | 12/2011 |

OPERATING METHOD OF NONVOLATILE MEMORY DEVICE AND OPERATING METHOD OF MEMORY CONTROLLER CONTROLLING THE NONVOLATILE MEMORY DEVICE

CROSS-REFERENCE TO RELATED APPLICATIONS

A claim for priority under 35 U.S.C. §119 is made to Korean Patent Application No. 10-2013-0090269, filed on Jul. 30, 2013, in the Korean Intellectual Property Office, the entire contents of which are hereby incorporated by reference.

BACKGROUND

1. Field

At least some example embodiments of the inventive concepts herein relate generally to a semiconductor memory device, and more particularly, to an operation method of a nonvolatile memory device and/or an operation method of a memory controller controlling the nonvolatile memory device.

2. Related Art

A semiconductor memory device is embodied using semiconductor such as silicon Si, germanium Ge, gallium arsenide GaAs, indium phospide InP, etc. A semiconductor memory device is classified into a volatile memory device and a nonvolatile memory device.

A volatile memory device loses its stored data when its power supply is interrupted. Examples of a volatile memory device include a static RAM (SRAM), a dynamic RAM (DRAM), a synchronous DRAM (SDRAM), etc. A nonvolatile memory device retains its stored data even when its power supply is interrupted. Examples of a nonvolatile memory device include a read only memory (ROM), a programmable ROM (PROM), an electrically programmable ROM (EPROM), an electrically erasable programmable ROM (EEPROM), a flash memory device, a phase-change RAM (PRAM), a magnetic RAM (MRAM), a resistive RAM (RRAM), a ferroelectric RAM (FRAM), etc.

As semiconductor integration technology improves, flash memory devices become smaller. Accordingly, a space between word lines may become more narrow. As a result, an incorrect operation may occur due to a coupling between word lines. To overcome these issues, a method is used of reading out a program state of memory cells connected to the selected word line by applying a voltage higher than an unselect read voltage by a predetermined level to word lines adjacent to a selected word line.

However, since a high voltage is applied to an adjacent word line, in the case that a flash memory device repeatedly reads a same page, deterioration of memory cells connected to the adjacent word line may occur. Since deteriorated memory cells may result in failed programming operations, reliability of a flash memory device can be degraded.

SUMMARY

Example embodiments of the inventive concepts described herein relate to nonvolatile memory device and, more particularly, relate to operating method of nonvolatile memory devices and a memory controller controlling nonvolatile memory devices.

According to at least one example embodiment, an operating method of a memory controller controlling a nonvolatile memory device including a plurality of pages includes receiving a read request and a logical address from an additional device; determining a program state of an upper unselected word line of a selected word line corresponding to the received logical address; and transmitting a physical address corresponding to the logical address, state information, and a read command to the nonvolatile memory device according to a result of the determination in response to the read request, wherein the state information indicates a level of a first unselect read voltage the nonvolatile memory device is to apply to the upper unselected word line.

The upper unselected word line may be a word line located nearest a string select line among word lines adjacent to the selected word line, and the selected word line is a word line connected to a page corresponding to the received logical address.

The operating method may further include controlling the nonvolatile memory device to perform a read operation by applying the first unselect read voltage to the upper unselected word line, applying a second unselect read voltage to a lower unselected word line adjacent to the selected word line, applying a third unselect read voltage to unselected word lines other than the upper unselected word line and the lower unselected word line, and sequentially applying a plurality of select read voltages to the selected word line, wherein the first unselect read voltage is equal to or higher than the third unselect read voltage and lower than the second unselect read voltage.

The operating method may further include controlling the nonvolatile memory device to perform a read operation by applying the first unselect read voltage to unselected word lines located between the string selection line and the selected word line, applying a second unselect read voltage to a lower unselected word line adjacent to the selected word line, applying a third unselect read voltage to word lines located between a ground select line and the selected word line among unselected word lines except the lower unselected word line, and sequentially applying a plurality of select read voltages to the selected word line, wherein the third unselect read voltage is higher than the first unselect read voltage and lower than the second unselect read voltage.

Controlling the nonvolatile memory device to perform a read operation may include controlling the nonvolatile memory device such that the first unselect read voltage has a level which is lower than at least one of the plurality of select read voltages.

Controlling the nonvolatile memory device to perform a read operation may include controlling the nonvolatile memory device such that the plurality of select read voltages are used as a verification read voltage for verifying a program result of the nonvolatile memory device.

The determining a program state of an upper unselected word line of a selected word line corresponding to the received logical address may include determining whether the selected page corresponding to the received logical address is a most recently programmed page based on mapping information between the received logical address and the physical address of the nonvolatile memory device.

The determining a program state of an upper unselected word line of a selected word line corresponding to the received logical address may further include judging that a state of the unselected word line is in an erase state if the selected page is the most recently programmed page.

The mapping information may be included in a flash translation layer being driven by the memory controller.

According to at least one example embodiment, an operating method of a nonvolatile memory device including a plurality of pages and a memory circuit having information identifying a most recently programmed page among the plurality of pages includes receiving a read command and a physical address from a memory controller; determining a state of an upper unselected word line of a selected word line connected to a selected page corresponding to the received physical address by comparing the received physical address with the information identifying the most recently programmed page in the memory circuit; applying a first unselect read voltage to the upper unselected word line and sequentially applying a plurality of select read voltages to the selected word line based on a result of the determination in response to the read command; applying a second unselect read voltage to a lower unselected adjacent word line of the selected word line; and applying a third unselect read voltage to unselected word lines other that the lower unselected adjacent word line and the upper unselected adjacent word line, wherein the first unselect read voltage is lower than a second unselect read voltage, and is equal to or higher than a third unselect read voltage.

The determining a state of an upper unselected word line of a selected word line connected to a selected page corresponding to the received physical address by comparing the received physical address with the information of the page programmed lastly stored in the memory circuit may include judging that the program state of the upper page is an erase state if the received physical address is included in information stored in the memory circuit; and judging that the program state of the upper page is a programmed state if the received physical address is not included in information stored in the memory circuit.

The operating method may further include reading out program states of memory cells connected to the selected word line on the basis of the plurality of select read voltages.

The page information stored in the memory circuit may be physical address information of the most recently programmed page.

The nonvolatile memory device may include a plurality of memory blocks, and the storage circuit may include the physical address information of the most recently programmed page of each of the memory blocks.

The nonvolatile memory device may be a NAND flash memory.

According to at least one example embodiment, an operating method of a memory controller controlling a nonvolatile memory device including a plurality of word lines comprises controlling the nonvolatile memory to perform a read operation by, selecting a word line, from among the plurality of word lines, to read, in accordance with a received address, and applying one or more read select voltages to the selected word line, a first voltage to the first word line adjacent to the selected word line, a second voltage to the second word line, being different from the first word line, adjacent to the selected word line, and a third voltage to word lines, from among the plurality of word lines, other than the selected, first adjacent and second adjacent word lines, when the selected word line include the most recently programmed page and the first and third voltages both being lower than the second voltage.

The first word line may be closer to a string select line of the nonvolatile memory device than the selected word line and the second word line.

The applying the first voltage may include applying the first voltage such that the first voltage is lower than the one or more read select voltages.

The applying the first voltage may include applying the first voltage such that the first voltage is equal to or higher than the third voltage.

The applying the first voltage may include applying the first voltage such that the first voltage is higher than the third voltage.

BRIEF DESCRIPTION OF THE FIGURES

Example embodiments of the inventive concepts will become more apparent in view of the attached drawings and accompanying detailed description. The example embodiments depicted therein are provided by way of example, not by way of limitation, wherein like reference numerals refer to the same or similar elements. The drawings are not necessarily to scale, emphasis instead being placed upon illustrating aspects of example embodiments of the inventive concepts.

DETAILED DESCRIPTION OF EXAMPLE EMBODIMENTS

Figure 1:
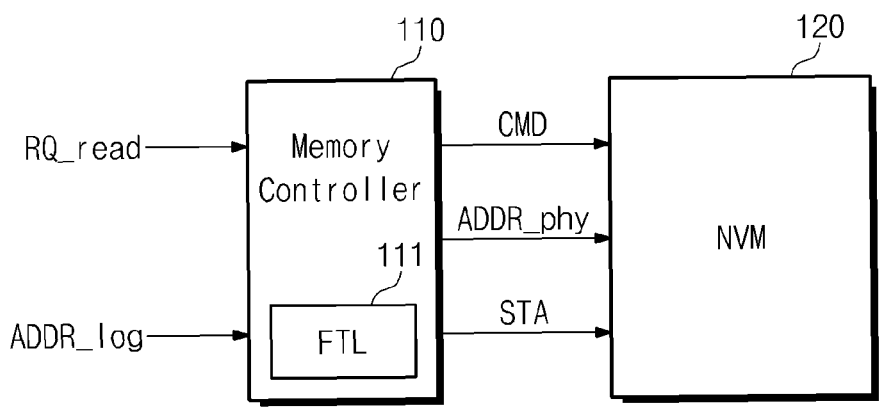
FIG. 1 is a block diagram illustrating a nonvolatile memory system according to at least some example embodiments of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A memory controller according to some embodiments of the inventive concepts can determine a state of an upper unselected word line of a selected word line connected to a selected page and reduce a level of an unselect read voltage being supplied to the upper unselected word line based on a result of determination. Accordingly, a read disturbance can be reduced and thereby a nonvolatile memory device having improved reliability and an operation method thereof are provided.

FIG. 1 is a block diagram illustrating a nonvolatile memory system according to at least some embodiments of the inventive concepts. Referring to FIG. 1, a nonvolatile memory system 100 includes a memory controller 110 and a nonvolatile memory device 120.

The memory controller 110 receives a read request RQ_read and a logical address ADDR_log from an external device (e.g., host, Application Processor, etc.) to control the nonvolatile memory device 120 based on the received read request RQ_read and the logical address ADDR_log. The memory controller 110 includes a flash translation layer (FTL) 111. The FTL 111 can provide an interface between the external device and the nonvolatile memory device 120 so that the nonvolatile memory device 120 is effectively used. In exemplary embodiments, the FTL 111 can manage a mapping relation between the logical address ADDR_log received from the external device and a physical address ADDR_phy of the nonvolatile memory device 120.

The nonvolatile memory device 120 operates in accordance to a control of the memory controller 110. The nonvolatile memory device 120 can receive a read command CMD and a physical address ADDR_phy from the memory controller 110. The nonvolatile memory device 120 can perform a read operation based on the received command CMD and physical address ADDR_phy. The nonvolatile memory device 120 includes a plurality of memory blocks. Each of the memory blocks includes a plurality of pages. The nonvolatile memory device 120 can perform a read/write operation by a page unit.

The memory controller 110 can determine a state of an upper unselected word line of a selected word line connected to a page corresponding to a logical address ADDR_log received from an external device on the basis of the logical address ADDR_log received from the external device and the FTL 111. For ease of description, it will be assumed that a selected word line indicates an word line connected to a page corresponding to a logical address ADDR_log received from an external device, an upper unselected word line is a word line located near a string select line among word lines adjacent to the selected word line and a lower word line is a word line located near a ground select line among word lines adjacent to the selected word line.

The memory controller 110 may transmit state information STA to the nonvolatile memory device 120 based on a result of a determination. For example, the FTL 111 includes mapping information between a logical address received from an external device and a physical address of the nonvolatile memory device 120. With reference to the mapping information included in the FTL 111, if a selected word line corresponding to a logical address ADDR_log received from an external device is a word line connected to a page programmed lastly (or the most recently programmed page), the memory controller 110 judges that a page connected to an upper unselected word line of a selected word line is in an erase state. In the case that the page connected to the upper unselected word line is judged to be in an erase state, the memory controller 110 transmits the state information STA to the nonvolatile memory device 120. The state information STA is information for controlling a level of an unselected read voltage being applied to the upper unselected word line. As used herein, the page programmed lastly means, for example, the most recently programmed page.

The nonvolatile memory device 120 can control a level of the unselect read voltage being applied to the upper unselected word line in response to the state information STA.

Figure 2:
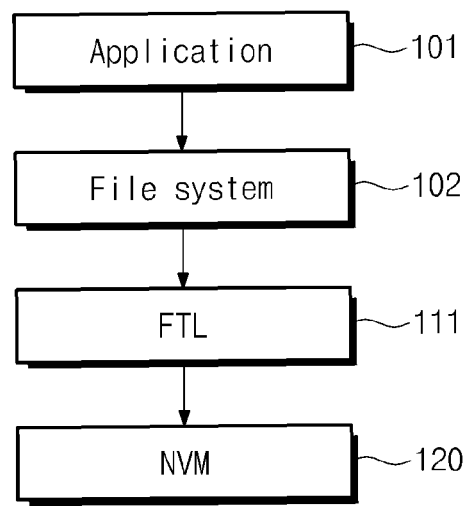
FIG. 2 is a block diagram illustrating a software layer of the nonvolatile memory system illustrated in FIG. 1.

FIG. 2 is a block diagram illustrating a software layer of the nonvolatile memory system illustrated in FIG. 1. Referring to FIGS. 1 and 2, a software layer of the nonvolatile memory system 100 includes an application 101, a file system 102, a file translation layer (FTL) 111 and a nonvolatile memory device 120.

The application 101 indicates various application programs being driven in an external device (e.g., a host, application processor, etc.). For example, the application 101 includes various computing programs such as a text editor, a web browser, an image player, a game program, etc.

In the case of storing file or data in the nonvolatile memory system 100, the file system 102 performs a function of organizing the file or the data. The file system 102 can provide a logical address ADDR_log according to a read request to the memory controller 110. The file system 102 may include a file allocation table (FAT), a FAT32, a NT File system (NTFS), a hierarchical file system (HFS), a journaled file system2 (JSF2), a XFS, an on-disk structure-5 (ODS-5), a UDF, a ZFS, a unix file system (UFS), ext2, ext3, ext4, ReiserFS, Reiser4, ISO, 9660, Gnome, VFS, EFS or WinFS.

The FTL 111 can provide an interface between an external device and the nonvolatile memory system 100 so that the nonvolatile memory system 100 is effectively used. The FTL 111 receives a logical address ADDR_log generated by the file system 102 to translate the logical address ADDR_log into a physical address ADDR_phy that can be used in the nonvolatile memory device 120. The FTL 111 manages an address translation through a mapping table. The FTL 111 may include page information programmed last from among a plurality of memory blocks included in the nonvolatile memory device 120. The FTL 111 is included in the memory controller 110 and can be driven by the memory controller 110.

The memory controller 110 determines an upper page state connected to an upper unselected word line with reference to the FTL 111.

Figure 3:
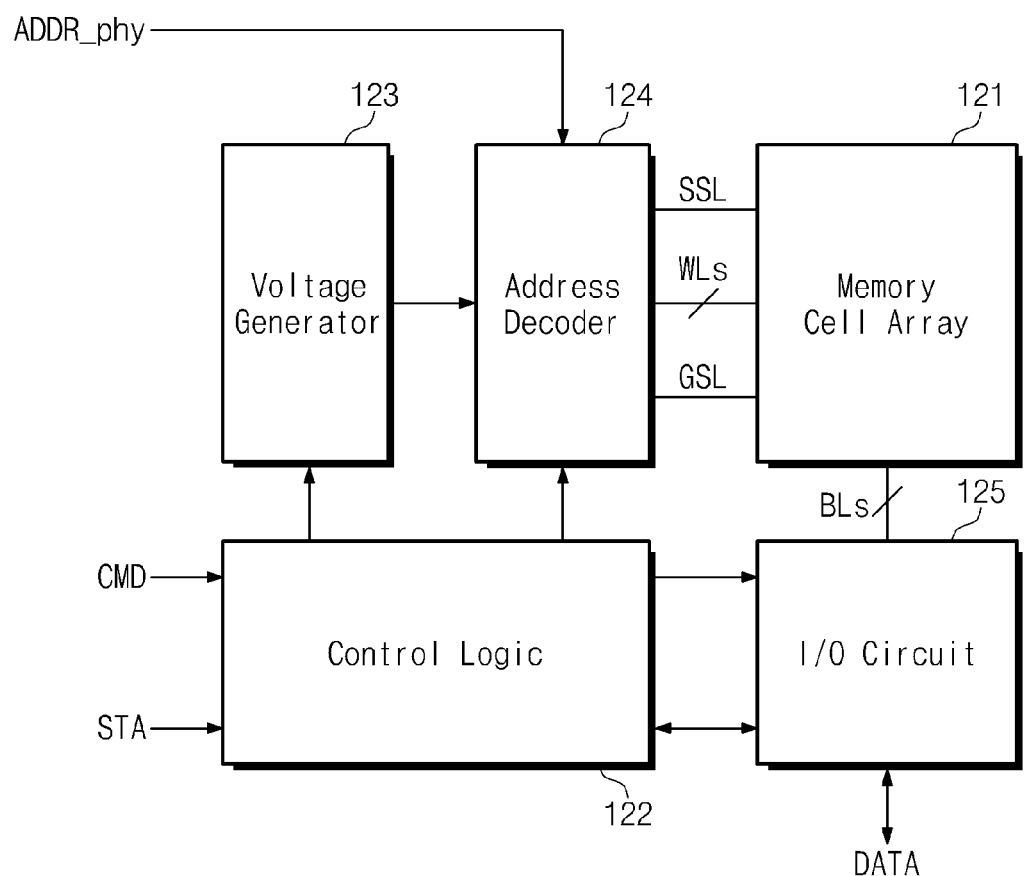
FIG. 3 is a block diagram illustrating a nonvolatile memory device illustrated in FIG. 1 in detail.

FIG. 3 is a block diagram illustrating a nonvolatile memory device illustrated in FIG. 1 in detail. Referring to FIG. 3, the nonvolatile memory device 120 includes a memory cell array 121, a control logic 122, a voltage generator 123, an address decoder 124 and an input/output circuit 125.

The memory cell array 121 is connected to the address decoder 124 via a plurality of word lines WLs and is connected to the input/output circuit 125 via a plurality of bit lines BLs. The memory cell array 121 includes a plurality of memory blocks. The memory blocks are constituted by a plurality of pages. The pages include a plurality of memory cells.

The control logic 122 receives command CMD and state information STA from the memory controller 110. The control logic 122 can control the voltage generator 123, the address decoder 124 and the input/output circuit 125 based on the received command CMD and state information STA. For example, if the command CMD received from the memory controller 110 is a read command, the control logic 122 can control the voltage generator 123, the address decoder 124 and the input/output circuit 125 so that data stored in the memory cell array 121 is read. The control logic 122 can control an unselect read voltage being applied to an unselected word line according to the state information STA.

The voltage generator 123 can generate various voltages being applied to a plurality of word lines WLs. The voltage generator 123 can generate a plurality of select read voltages and a plurality of unselect read voltages for determining states of a plurality of memory cells included in the memory cell array 121.

The address decoder 124 can receive an address ADDR from the memory controller 110. The address decoder 124 is connected to the memory cell array 121 through a string select line SSL, a plurality of word lines WLs and a ground select line GSL. The address decoder 124 can decode the received address ADDR to select any one of the word lines WLs. The address decoder 124 can sequentially or, alternatively, simultaneously, apply a plurality of select read voltages to a select word line and a plurality of unselect read voltages to unselected word lines by a control of the control logic 122.

The input/output circuit 125 is connected to the memory cell array via a plurality of bit lines BLs. The input/output circuit 125 can detect a voltage change of the bit lines BLs to output data or can control voltages of the bit lines BLs to write data in the memory cell array 121.

In exemplary embodiments, the nonvolatile memory device 120 receives a command CMD, an address ADDR and state information STA from the memory controller 110 and performs a read operation. The nonvolatile memory device 120 can control a level of an unselect read voltage being applied to an upper unselected word line of a select word line corresponding to the received address ADDR according to the state information STA. A level of the unselect read voltage being applied to the upper unselected word line is lowered by a predetermined level as compared with a level of an unselect read voltage being applied to a lower unselected word line. Thus, since deterioration of a memory cell connected to the upper unselected word line is reduced, a nonvolatile memory device having improved reliability is provided.

Figure 4:
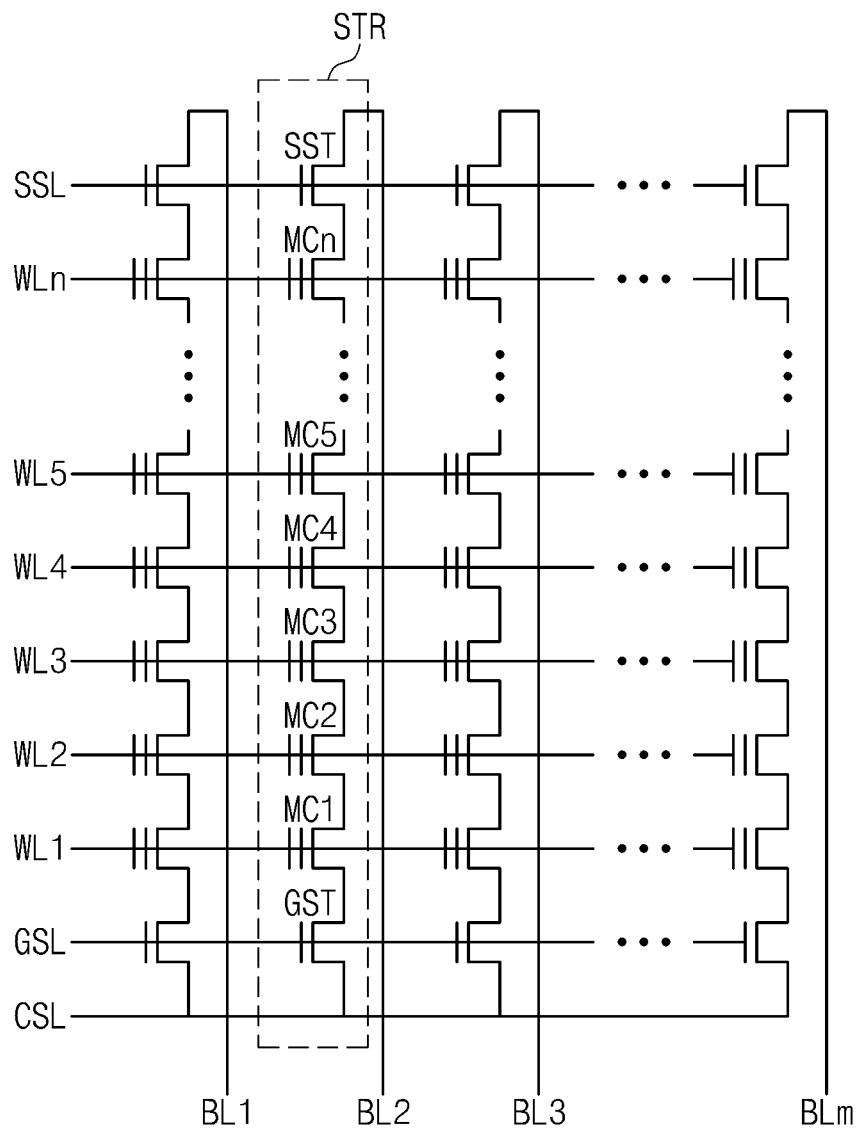
FIG. 4 is a circuit diagram illustrating a memory cell array illustrated in FIG. 3 in detail.

FIG. 4 is a circuit diagram illustrating a memory cell array illustrated in FIG. 3 in detail. For ease of description, one memory block among a plurality of memory blocks included in the memory cell array 121 is illustrated in FIG. 4.

The memory cell array 121 includes a plurality of strings STR. Each string STR includes a string select transistor SST, a ground select transistor GST and a plurality of memory cells MC1~MCn. The memory cells MC1~MCn are serially connected between the string select transistor SST and the ground select transistor GST.

An end of each of the string select transistors SST is connected to a bit line BL. Gates of the string select transistors SST are connected to a string select line SSL. Ends of the ground select transistors GST are connected to a common source line CSL. Gates of the ground select transistors GST are connected to a ground select line GSL. Gates of the memory cells MC1~MCn are connected to a plurality of word line WL1~WLn.

When a read operation of the nonvolatile memory device 120 is performed, a plurality of select read voltages is sequentially applied to a selected word line and a plurality of unselect read voltages is applied to unselected word lines. In exemplary embodiments, when the nonvolatile memory device 120 reads a page that was programmed last, a third unselect read voltage is applied to a lower word line adjacent to a selected word line, a first unselect read voltage is applied to an upper unselected word line adjacent to a selected word line, and a second unselect read voltage is applied to rest of unselected word lines. The second unselect read voltage is higher than the first unselect read voltage and lower than the third unselect read voltage. In the case that a page connected to a fourth word line WL4 is a selected page, an upper page is a page connected to a fifth word line WL5. That is, the upper page indicates a page located near a string select line SSL among pages adjacent to the selected page.

According to at least some example embodiments of the inventive concepts, an upper page of a page programmed lastly is in an erase state. In the case that a read operation of the page programmed lastly is performed, deterioration of memory cells included in an upper page can be reduced by lowering an unselect read voltage being applied to the upper page by a predetermined level. Thus, a nonvolatile memory system having improved reliability is provided.

Figure 5:
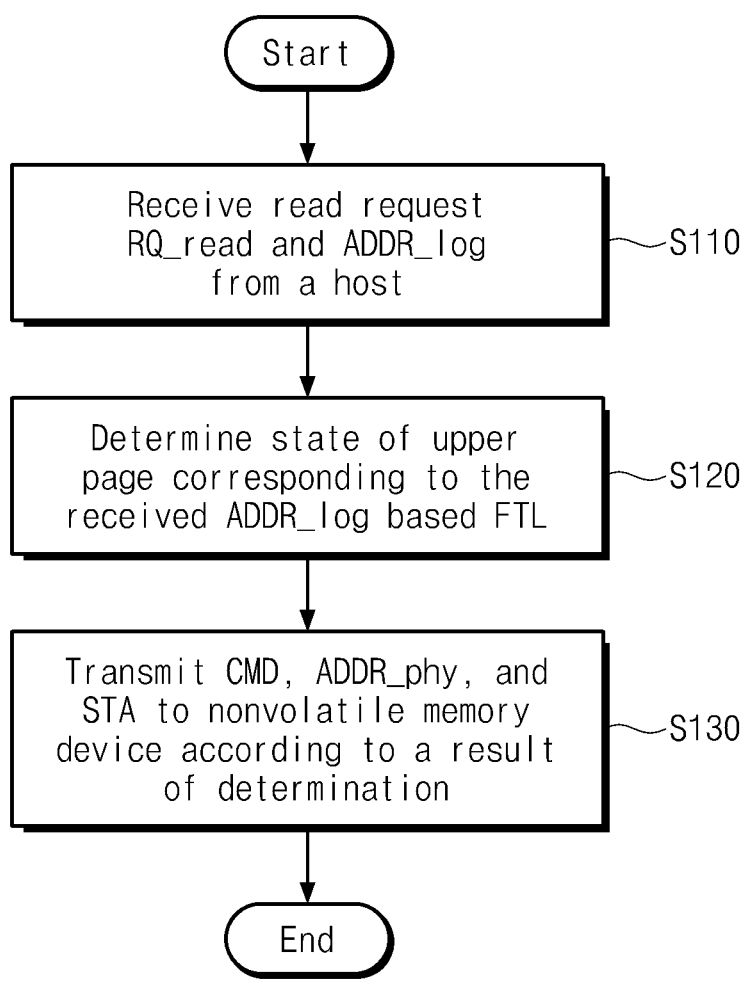
FIG. 5 is a flow chart illustrating an operation of a memory controller illustrated in FIG. 1.

FIG. 5 is a flow chart illustrating an operation of a memory controller illustrated in FIG. 1. Referring to FIGS. 1 and 5, in step S110, the memory controller 110 receives a read request RQ_read and a logical address ADDR_log from an external device (e.g. host, AP, etc.). The logical address ADDR_log may be an address generated from a file system of an external device.

In step S120, the memory controller 110 determines a state of an upper unselected word line corresponding to the received logical address ADDR_log on the basis of the FTL 111. As described with reference to FIGS. 1 and 2, the FTL 111 includes mapping information of a logical address ADDR_log received from an external device and a physical address ADDR_phy of the nonvolatile memory device 120. The FTL 111 may include physical information of a page programmed lastly of a plurality of memory blocks included in the nonvolatile memory device 120.

The memory control 110 determines a program state of a page corresponding to the received logical address ADDR_log by comparing the received logical address ADDR_log and the page information programmed lastly of the FTL 111. In the case that physical address of page corresponding to the received logical address ADDR_log and physical address information of a page programmed last coincide with each other, the memory controller 110 judges that a state of an upper unselected word line is an erase state. On the other hand, in the case that physical address of page corresponding to the received logical address ADDR_log and physical address information of a page programmed lastly are different from each other, the memory controller 110 judges that a state of an upper unselected word line is not an erase state. The upper unselected word line is a word line located near a string select line SSL among unselected word lines adjacent to a selected word line.

In step S130, the memory controller 110 transmits a read command CMD, a physical address ADDR_phy and state information STA to the nonvolatile memory device 120 according to a result of determination. For example, the memory controller 110 can control the nonvolatile memory device 120 such that the nonvolatile memory device 120 performs a read operation of a selected page in response to a received read request RQ_read. At this time, the memory controller 110 transmits the read command CMD, the physical address ADDR_phy and the state information STA to the nonvolatile memory device 120. The state information STA includes information for controlling an unselect read voltage being applied to an upper unselected word line.

In exemplary embodiments, the nonvolatile memory device 120 reads out data of a selected page corresponding to the physical address ADDR_phy in response to the read command CMD, the physical address ADDR_phy and the state information STA that are received from the memory controller 110.

Figure 6:
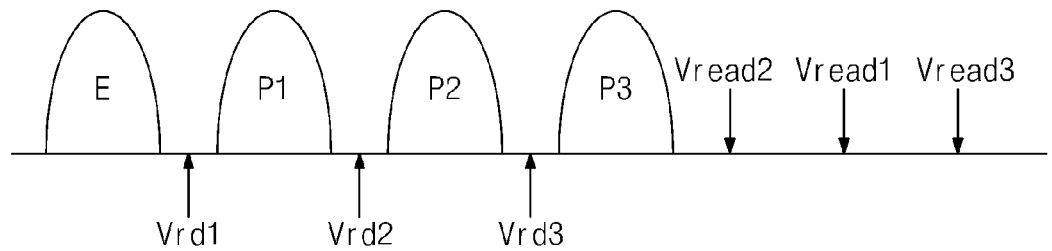
FIGS. 6, 7 and 8 are drawings for explaining an operation of the nonvolatile memory device illustrated in FIG. 1.
Figure 7:
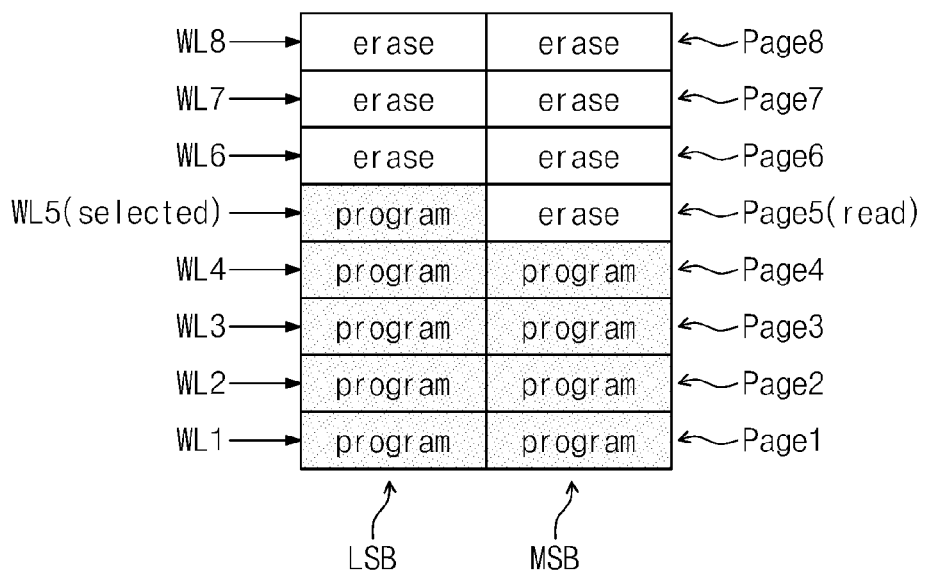
Figure 8:
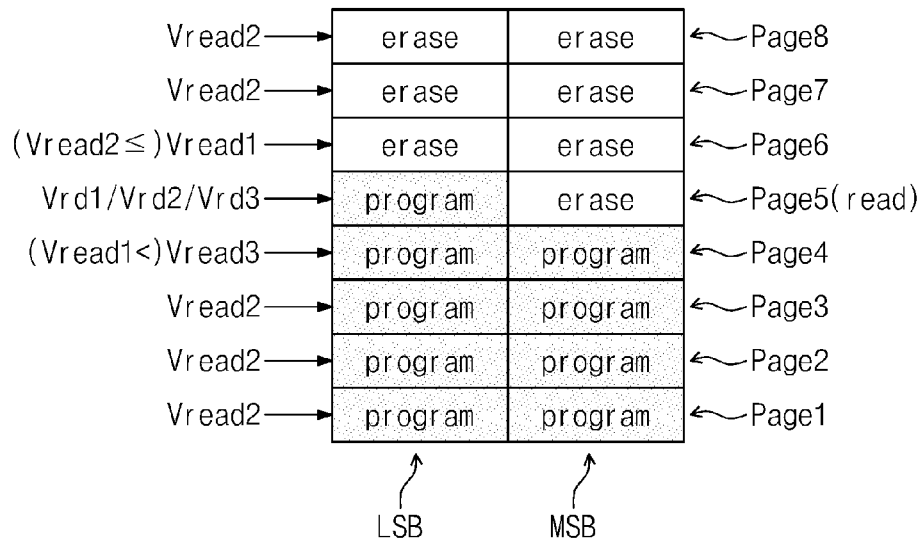

FIGS. 6, 7 and 8 are drawings for describing an operation of the nonvolatile memory device illustrated in FIG. 1. The nonvolatile memory device 120 may receive a read command CMD, a physical address ADDR_phy, and state information STA from the memory controller 110 and operate in response to the received signals. FIG. 6 is a drawing illustrating a threshold voltage distribution of memory cells included in the memory cell array 121. FIGS. 7 and 8 are drawings for describing a program state of the memory cell array 121 and a read voltage applying method of the memory cell array 121.

Referring to FIG. 6, the memory cells included in the memory cell array 121 may be provided as a multi-level cell (MLC). The memory cells can store at least 2 bits. For ease of description, it will be assumed that the memory cells are a multi-level cell (MLC) storing 2-bit data.

The memory cells may have any one state among an erase state E and first to third program states P1 to P3. A threshold voltage of memory cells having the first program state P1 is higher than a threshold voltage of memory cells having the erase state E. A threshold voltage of memory cells having the second program state P2 is higher than the threshold voltage of memory cells having the first program state P1. A threshold voltage of memory cells having the third program state P3 is higher than the threshold voltage of memory cells having the second program state P2.

To read out a program state of memory cells connected to a selected word line, first through third select read voltages Vrd1~Vrd3 may be sequentially applied to the selected word line and first to third unselect read voltages Vread1 to Vread3 may be applied to the unselected word lines. The first unselect read voltage Vread1 may be equal to or higher than the second unselect read voltage Vread2. The first unselect read voltage Vread1 may be lower than the third unselect read voltage Vread3. (i.e. Vread2 Vread1<Vread3) In exemplary embodiments, the first to third select read voltages Vrd1 to Vrd3 may be used as a program verify read voltage of the nonvolatile memory device 120.

With reference to FIGS. 7 and 8, a method of applying the first to third select read voltages Vrd1 to Vrd3 and the first to third unselect read voltages Vread1 to Vread3 to a plurality of word lines is described.

Referring to FIGS. 7 and 8, the memory cell array 121 includes first to eighth pages Page1 to Page8. The first to eighth pages Page1 to Page8 may be programmed by page ordering. For ease of description, it will be assumed that LSB and MSB of the first to fourth pages Page1 to Page4 are programmed, LSB of the fifth page Page5 is programmed and the sixth to eighth pages Page6 to Page8 are in an erase state. That is, a page programmed last in the memory cell array 121 is the fifth page Page5. However, at least some example embodiments of the inventive concepts are not limited thereto. The memory cell array 121 may include a plurality of memory blocks, the memory blocks may include a plurality of pages and the pages may be sequentially programmed from a lower page.

The memory controller 110 can receive a read request RQ_read and a logical address ADDR_log corresponding to the fifth page Page5. The memory controller 110 can determine a program state of the upper page Page6 of the fifth page Page5 corresponding to the received logical address ADDR_log on the basis of the method described with reference to the step S120 of FIG. 5. At this time the fifth page Page5 may be a page programmed last. Since physical address information of the page programmed lastly is included in the FTL 111, the memory controller 110 judges that the upper page Page6 of the fifth page Page5 corresponding to the logical address ADDR_log is in an erase state.

As illustrated in FIG. 8, to read out data of memory cells included in the fifth page Page5, the nonvolatile memory device 120 sequentially applies the first to third select read voltages Vrd1 to Vrd3 to a selected word line connected to the fifth page Page5, applies the first unselect read voltage Vread1 to an upper unselected word line connected to the upper page Page6 of the fifth page Page5, applies the third unselect read voltage Vread3 to a lower unselected word line connected to the lower page Page4 of the fifth page Page5, and applies the second unselect read voltage Vread2 to the rest of the word lines.

Since a page programmed last is the fifth page Page5, the sixth page Page6 is in an erase state. That is, although a level of an unselect read voltage being supplied to a word line connected to the sixth page Page6 is lowered by a predetermined or, alternatively, desired level, memory cells included in the sixth page Page6 become on-cells and thereby data of the fifth page Page5 can be read out. Since a level of an unselect read voltage being supplied to a word line connected to the sixth page Page6 is lowered by a predetermined or, alternatively, desired level, deterioration of memory cells included in the sixth page Page6 is reduced and thereby reliability is guaranteed in a program operation thereafter. Thus, a nonvolatile memory system having improved reliability is provided.

Figure 9:
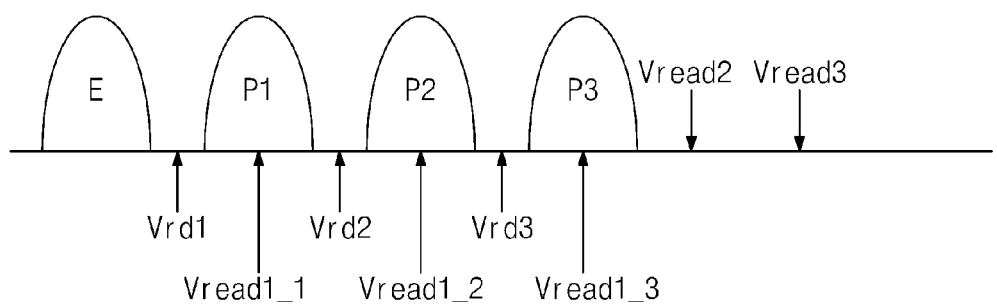
FIGS. 9 and 10 are drawings for explaining an operation of a nonvolatile memory device according at least some example embodiments of the inventive concepts.
Figure 10:
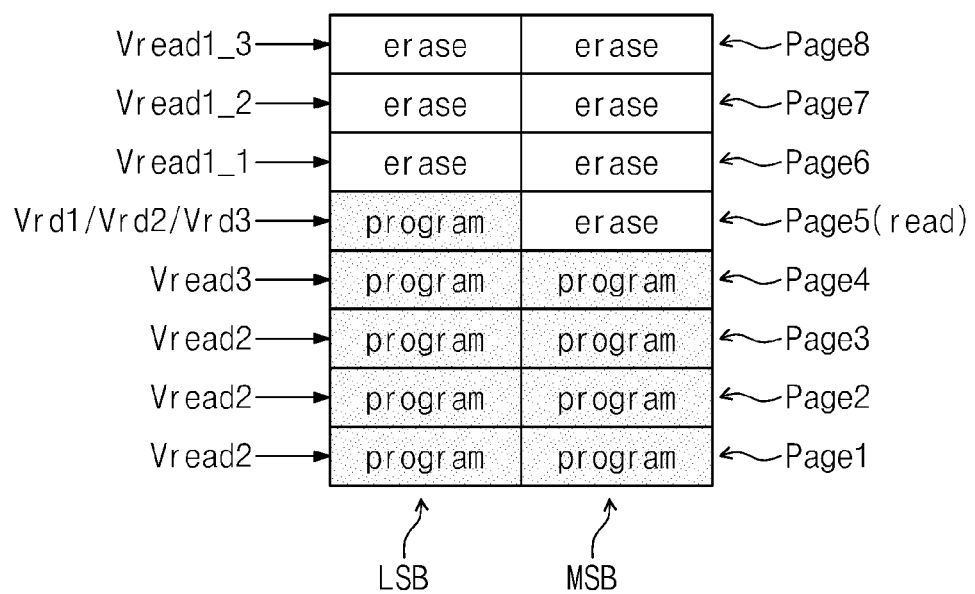

FIGS. 9 and 10 are drawings for explaining an operation of a nonvolatile memory device according to at least some example embodiments of the inventive concepts. Referring to FIGS. 9 and 10, unlike the first unselect read voltage Vread1 illustrated in FIG. 6, first unselect read voltages (Vread1_1, Vread1_2, Vread1_3) illustrated in FIG. 9 have a level lower than a second unselect read voltage Vread2. The first unselect read voltages (Vread1_1, Vread1_2, Vread1_3) may be lower than respective threshold voltages of memory cells having first to third program states P1 to P3.

Since upper pages (pages located toward a string select line SSL from a selected page Page5, that is, Page6~Page8) of a selected page Page5 are in an erase state, even though the first unselect read voltages (Vread1_1, Vread1_2, Vread1_3) are applied, memory cells of the upper pages Page6~Page8 may be on-cells. That is, in the case that the nonvolatile memory device 120 reads out data of the fifth page Page5, the nonvolatile memory device 120 applies the second unselect read voltage Vread2 to unselected word lines connected to first to third pages Page1 to Page3, applies any one of the first unselect read voltages (Vread1_1, Vread1_2, Vread1_3) to unselected word lines connected to sixth to eighth pages Page6 to Page8 and sequentially applies first to third select read voltages Vrd1 to Vrd3 to a selected word line connected to the fifth page Page5.

Deterioration of memory cells included in upper pages can be reduced by applying an unselect read voltage of a low level to the upper pages of a selected page. Thus, a nonvolatile memory system having improved reliability is provided.

Figure 11:
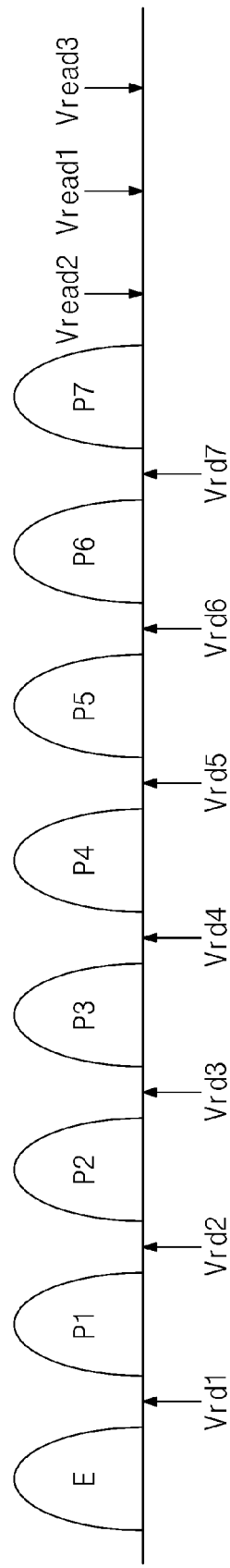
FIG. 11 is a drawing illustrating a threshold voltage distribution of a memory cell according to at least some example embodiments of the inventive concepts.

FIG. 11 is a drawing illustrating a threshold voltage distribution of a memory cell according to some at least some example embodiments of the inventive concepts. Referring to FIG. 11, a plurality of memory cells included in the memory cell array 121 may be provided as a multi-bit cell of 3 bit. The memory cells may have any one state among an erase state E and first to seventh program states P1 to P7.

To read out data of a selected page, the nonvolatile memory device 120 sequentially applies first to seventh select read voltages Vrd1 to Vrd7 to a word line connected to the selected page and applies first to third unselect read voltages Vread1 to Vread3 to unselected word lines. The nonvolatile memory device 120 applies the unselect read voltages Vread1 to Vread3 to the unselected word lines on the basis of the method described with reference to FIGS. 6 and 7 in response to state information STA received from the memory controller 110. That is, according to a program state of an upper page of a selected page, the nonvolatile memory device 120 applies the first unselect read voltage Vread1 to an unselected word line connected to the upper page, applies the third unselect read voltage Vread3 to an unselected word line connected to a lower page and applies the second unselect read voltage Vread2 to the rest of the unselected word lines. The first unselect read voltage Vread1 is equal to or higher than the second unselect read voltage Vread2. The first unselect read voltage Vread1 is lower than the third unselect read voltage Vread3. (i.e. Vread2≤Vread1<Vread3 The first to seventh select read voltages Vrd1 to Vrd7 can be used as a program verify voltage.

Figure 12:
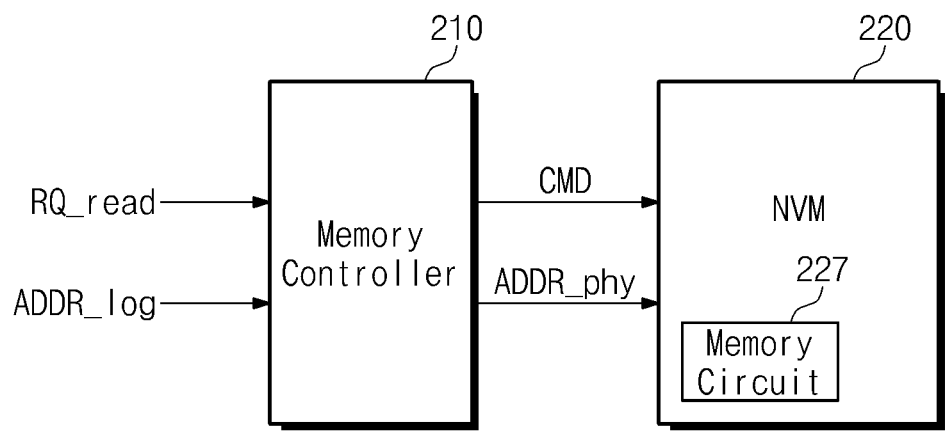
FIG. 12 is a block diagram illustrating a nonvolatile memory system according to at least some example embodiments of the inventive concepts.

FIG. 12 is a block diagram illustrating a nonvolatile memory system according to some at least some example embodiments of the inventive concepts. Referring to FIG. 12, a nonvolatile memory system 200 includes a memory controller 210 and a nonvolatile memory device 220. The memory controller 210 and the nonvolatile memory device 220 perform an operation similar to constitution elements of the nonvolatile memory system 100 described with reference to FIG. 1. A difference between the nonvolatile memory system 200 of FIG. 12 and the nonvolatile memory system 100 of FIG. 1 is mainly described below.

The memory controller 210 can receive a read request RQ_read and a logical address ADDR_log from an external device (e.g., a host or application processor (AP)). The memory controller 210 can map the received logical address ADDR_log and a physical address ADDR_phy of the nonvolatile memory device 220 on the basis of an operation of a FTL. The memory controller 210 can transmit a read command CMD and a physical address ADDR_phy corresponding to the received logical address ADDR_log to the nonvolatile memory device 220.

The nonvolatile memory device 220 receives the physical address ADDR_phy and the read command CMD from the memory controller 110 and can perform a read operation on the basis of the received physical address ADDR_phy and the read command CMD. Unlike the nonvolatile memory device 120 of FIG. 1, the nonvolatile memory device 220 of FIG. 12 further includes a memory circuit 227. The memory circuit 227 includes information of a page programmed last with respect from among memory blocks included in a memory cell array. The information of the page programmed last may be a physical address of the page programmed last. The nonvolatile memory device 220 may include a plurality of memory blocks. The memory circuit 227 may include information of a page programmed last corresponding to each of the memory blocks.

In the nonvolatile memory system 100 of FIG. 1, the memory controller 110 determines a state of an upper page with reference to the FTL 111 but the nonvolatile memory system 200 of FIG. 12 further includes the memory circuit 227 and the memory circuit 227 includes information of a page programmed last. The nonvolatile memory device 220 compares information stored in the memory circuit 227 with the physical address ADDR_phy received from the memory controller 210 to determine a state of an upper page.

The nonvolatile memory device 220 can compare the received physical address ADDR_phy with information stored in the memory circuit 227 to determine a state of an upper page of a page corresponding to the physical address ADDR_phy. In the case that the received physical address ADDR_phy is included in the memory circuit 227, the page corresponding to the received physical address ADDR_phy may be a page programmed lastly. Thus, the upper page of the page corresponding to the received physical address ADDR_phy may be in an erase state.

In the case that it is judged that the upper page of the page corresponding to the received physical address ADDR_phy is in an erase state, the nonvolatile memory device 220 reads data on the basis of the method of applying a select read voltage and an unselect read voltage described with reference to FIGS. 6 through 10.

Figure 13:
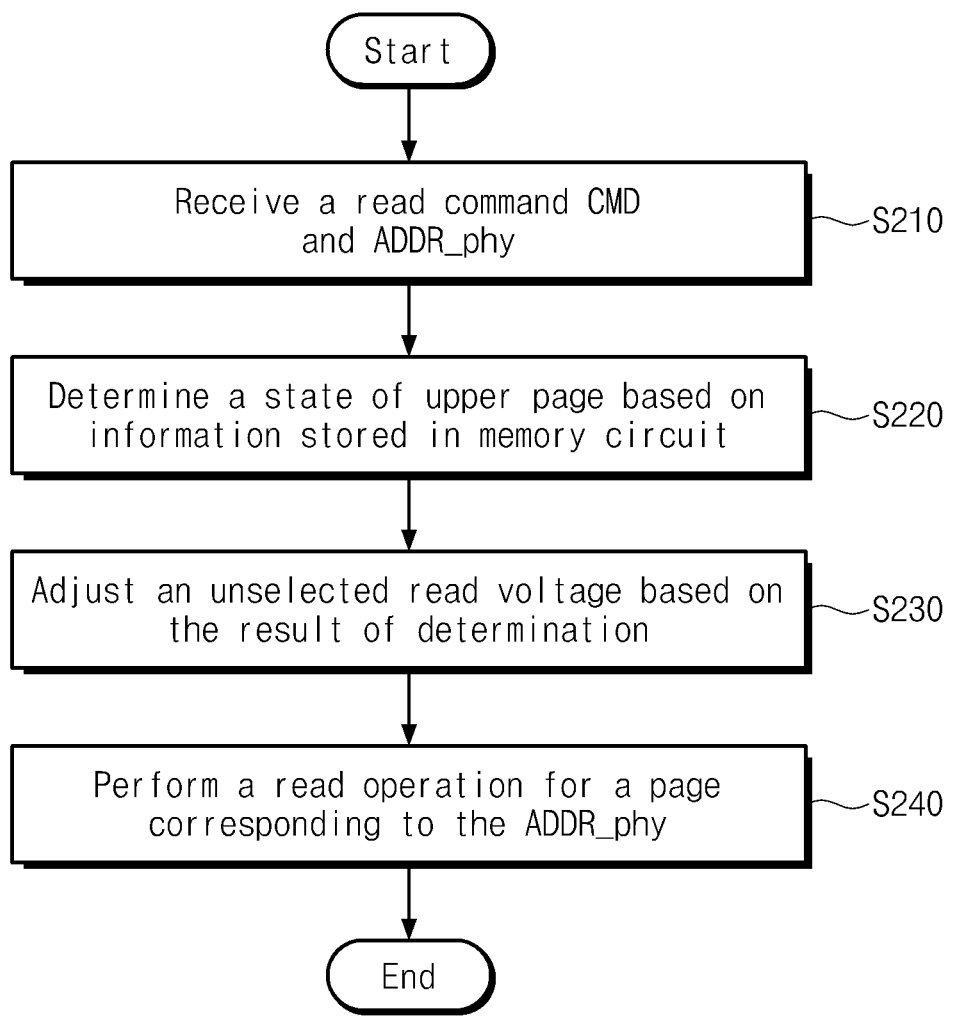
FIG. 13 is a flow chart illustrating an operation of a nonvolatile memory device illustrated in FIG. 12.

FIG. 13 is a flow chart illustrating an operation of a nonvolatile memory device illustrated in FIG. 12. Referring to FIGS. 12 and 13, in a step S210, the nonvolatile memory device 220 receives a read command CMD and a physical address ADDR_phy from the memory controller 210.

In a step S220, the nonvolatile memory device 220 determines a state of an upper page on the basis of information stored in the memory circuit 227. The nonvolatile memory device 220 compares the received physical address ADDR_phy with information stored in the memory circuit 227 to determine a state of an upper page. In the case that the received physical address ADDR_phy is included in the memory circuit 227, a state of an upper page of a page corresponding to the received physical address ADDR_phy may be an erase state. On the other hand, in the case that the received physical address ADDR_phy is not included in the memory circuit 227, a state of an upper page of a page corresponding to the received physical address ADDR_phy may be a program state.

In a step S230, the nonvolatile memory device 220 controls an unselect read voltage on the basis of a result of determination. In the case that a state of an upper page is an erase state, the nonvolatile memory device 220 can lower a level of an unselect read voltage being applied to a word line connected to the upper page by a predetermined level.

In a step S240, the nonvolatile memory device 220 performs a read operation of a page corresponding to the received physical address ADDR_phy. For example, the nonvolatile memory device 220 applies a first unselect read voltage to an upper unselected word line, applies a second unselect read voltage to a lower unselected word line, applies a third unselect read voltage to the rest of unselect word lines and sequentially applies a plurality of select read voltages to a selected word line (for example, a word line connected to a page corresponding to the received physical address ADDR_phy). The first unselect read voltage is equal to or higher than the second unselect read voltage and lower than the third unselect read voltage.

The nonvolatile memory device 220 can compare the received physical address ADDR_phy with information stored in the memory circuit 227 to determine a state of an upper page. The nonvolatile memory device 220 can lower a level of an unselect read voltage being applied to a word line connected to the upper page by a predetermined level. Accordingly, deterioration of memory cells included in the upper page is reduced and thereby reliability is improved in a program operation thereafter. Thus, a nonvolatile memory system having improved reliability is provided.

Figure 14:
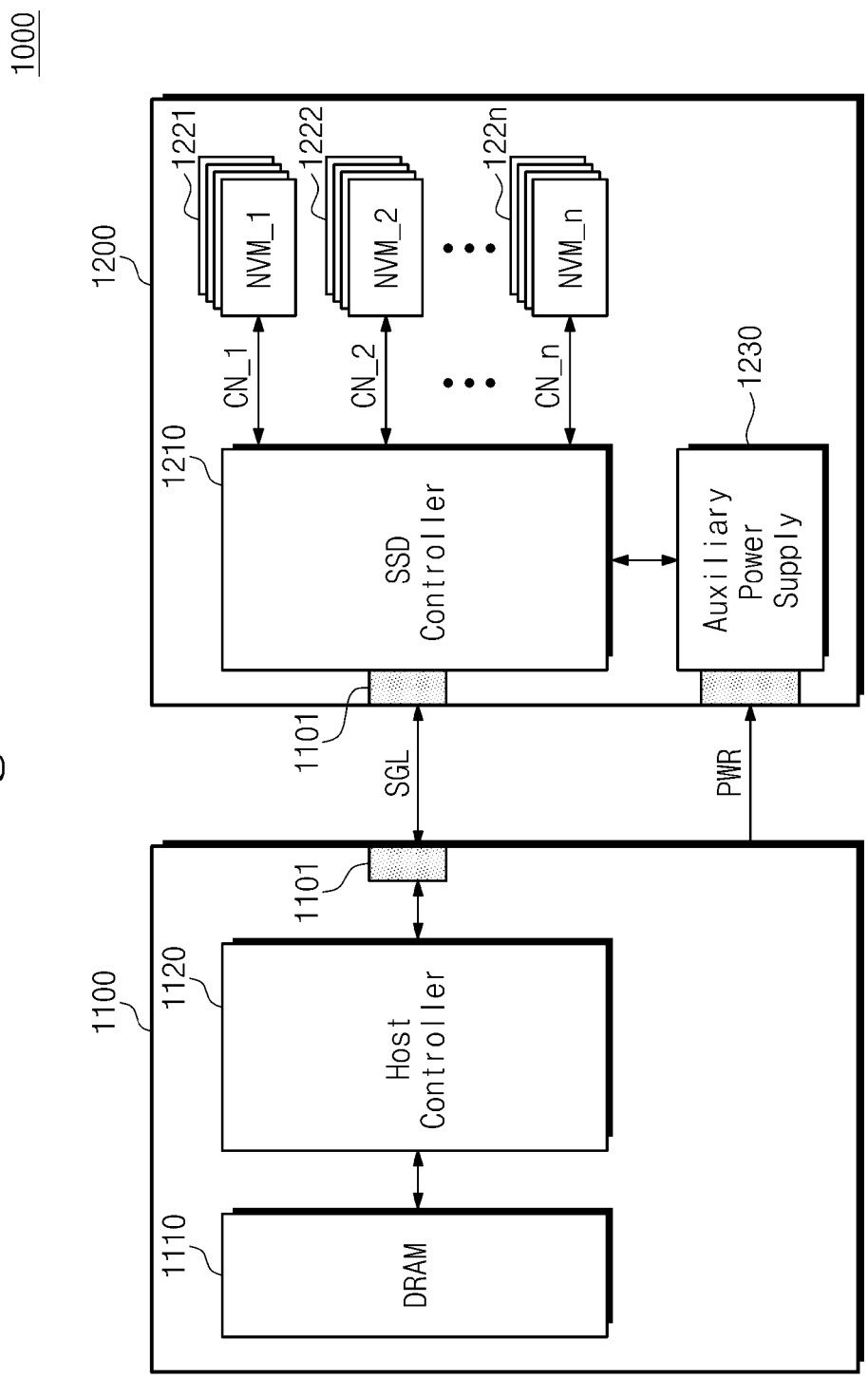
FIG. 14 is a block diagram a solid state drive (SSD) to which a nonvolatile memory system according to at least some example embodiments of the inventive concepts is applied.

FIG. 14 is a block diagram a solid state drive (SSD) to which a nonvolatile memory system in accordance with the inventive concepts is applied.

Referring to FIG. 14, a SSD system 1000 includes a host 1100 and a SSD 1200. The host 1100 includes a host interface 1101, a DRAM 1110 and a host controller 1120.

The host 1100 writes data in the SSD 1200 or reads data stored in the SSD 1200. The host controller 1120 transmits a signal SGL such as a command, an address, state information, etc. to the SSD 1200 through the host interface 1101. The DRAM 1110 is a main memory of the host 1100. The host 1100 can exchange a signal SGL with the SSD 1200 through the host interface 1101. The host interface 1101 may include various interfaces such as a USB (universal serial bus), a MMC (multimedia card), a PCI (peripheral component interconnection), a PCI-E (PCI-express), an ATA (advanced technology attachment), a serial-ATA, a parallel-ATA, a SCSI (small computer small interface), an ESDI (enhanced small disk interface), an IDE (integrated drive electronics), a MIPI (mobile industry disk interface), etc.

The SSD 1200 exchanges a signal SGL with the host 1100 through the host interface 1101 and is supplied with a power supply through a power connector 1202. The SSD 1200 may include a plurality of nonvolatile memories 1221~122n, a SSD controller 1210 and an auxiliary power supply device 1230. The nonvolatile memories 1221~122n may be embodied by a PRAM, a MRAM, a ReRAM and a PRAM besides a NAND flash memory.

The nonvolatile memories 1221~122n are used as a storage medium of the SSD 1200. The nonvolatile memories 1221~122n can be connected to the SSD controller 1210 through a plurality of channels CH1~CHn. At least one nonvolatile memory device can be connected to one channel. Nonvolatile memories connected to a same channel can be connected to a same data bus.

The SSD controller 1210 exchanges a signal SGL with the host 1100 through the host interface 1201. The signal SGL may include a command, an address, data, etc. The SSD controller 1210 writes data in a corresponding nonvolatile memory device or reads data from a corresponding nonvolatile memory device according to a command of the host 1100.

The auxiliary power supply device 1230 is connected to the host 1100 through the power connector 1202. The auxiliary power supply device 1230 can be located inside the SSD 1200 or can be outside the SSD 1200. The auxiliary power supply device 1230 can be located on a main board and can supply an auxiliary power supply to the SSD 1200.

The SSD controller 1210 and the nonvolatile memory devices 1221~122n can read data stored in the nonvolatile memory device on the basis of the read operation method described with reference to FIGS. 1 through 13. For example, according to at least one example embodiment, the SSD controller 1210 and the nonvolatile memory devices 1221~122n are configured to read data stored in the nonvolatile memory device using one or more of the read operation methods described with reference to FIGS. 1 through 13.

Figure 15:
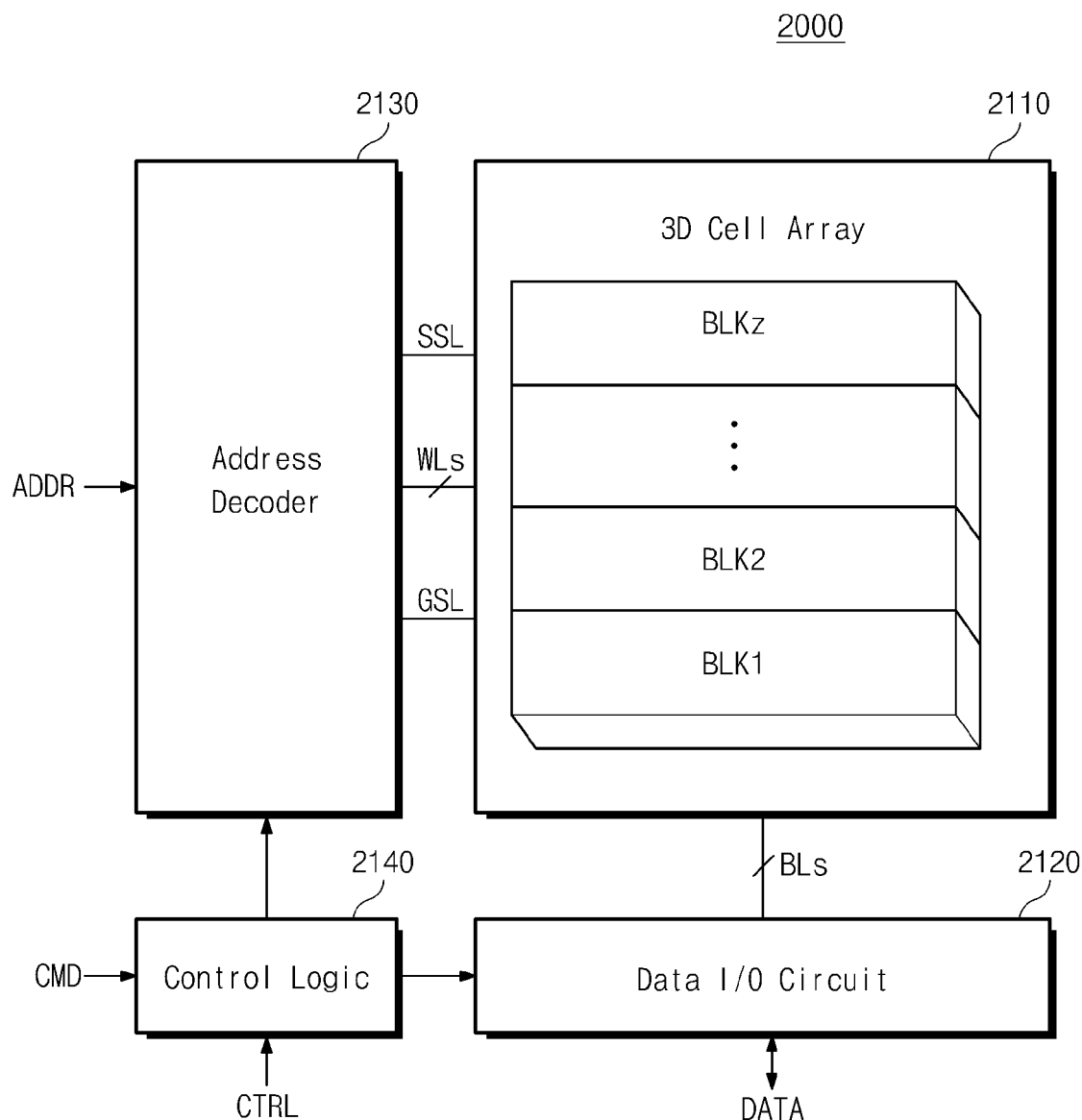
FIG. 15 is a block diagram illustrating a nonvolatile memory device according to at least some example embodiments of the inventive concepts.

FIG. 15 is a block diagram illustrating a nonvolatile memory device according to the inventive concepts.

Referring to FIG. 15, a nonvolatile memory device 2000 includes a three-dimensional cell array 2110, a data input/output circuit 2120, an address decoder 2130 and control logic 2140.

The three-dimensional cell array 2110 includes a plurality of memory blocks BLK1~BLKz. Each of the memory blocks BLK1~BLKz may have a three-dimensional structure (or a vertical structure). In a memory block having a two-dimensional structure (or a horizontal structure), memory cells are formed in a direction parallel to a substrate. However, in a memory block having a three-dimensional structure (or a vertical structure), memory cells are formed in a direction perpendicular to a substrate. Each memory block is an erase unit of the nonvolatile memory device 2000.

The data input/output circuit 2120 is connected to the three-dimensional cell array 2110 through a plurality of bit lines BLs. The data input/output circuit 2120 receives data DATA from an external device or outputs data DATA read from the three-dimensional cell array 2110 to an external device. The address decoder 2130 is connected to the three-dimensional cell array 2110 through a plurality of word lines WLs and select lines (SSL, GSL). The address decoder 2130 receives an address ADDR to select a word line.

The control logic 2140 controls program, read and erase operations of the nonvolatile memory device 2000. For example, when a program operation is performed, the control logic 2140 controls the address decoder 2130 so that a program voltage is provided to a selected word line and controls the input/output circuit 2120 so that data is programmed.

The control logic 2140 can operate based on the read operation method described with reference to FIGS. 1 through 13. For example, according to at least one example embodiment, The control logic 2140 is configured to read data stored in the nonvolatile memory device using one or more of the read operation methods described with reference to FIGS. 1 through 13.

The nonvolatile memory device 2000 can further include a memory circuit (not shown). The nonvolatile memory device 2000 including the memory circuit can read data on the basis of the read operation method described with reference to FIGS. 12 and 13.

Figure 16:
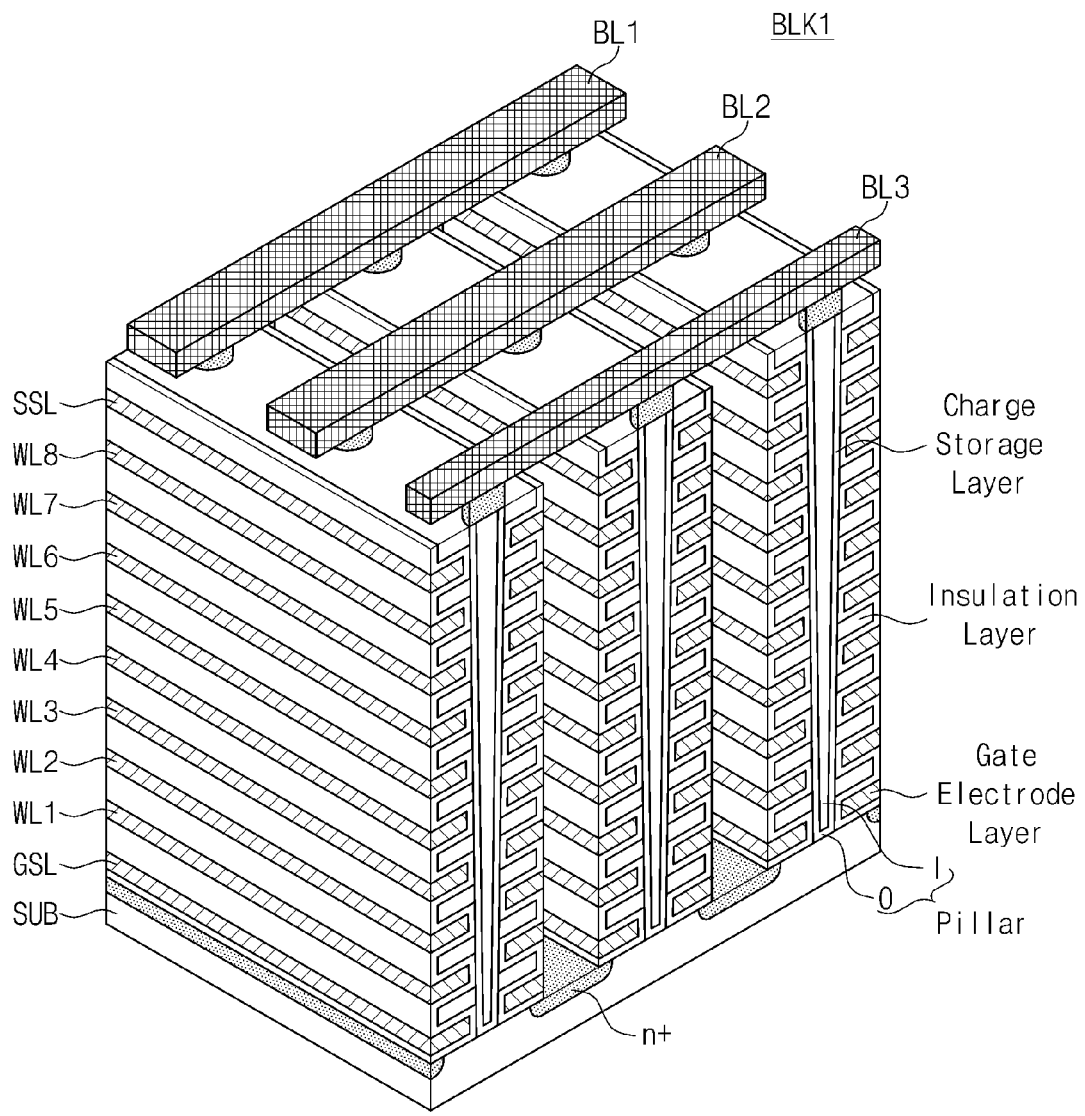
FIGS. 16 and 17 are perspective views illustrating a three-dimensional structure of a memory block illustrated in FIG. 15.

FIG. 16 is a perspective view illustrating a three-dimensional structure of a memory block illustrated in FIG. 15. Referring to FIG. 16, a memory block BLK1 is formed in a direction perpendicular to a substrate SUB. An n+ doping region is formed in the substrate SUB. A gate electrode layer and an insulation layer are alternately deposited on the substrate SUB. A charge storage layer can be formed between the gate electrode layer and the insulation layer.

The gate electrode layer and the insulation layer are vertically patterned to form a pillar of a V charter shape. The pillar penetrates the gate electrode layer and the insulation layer to be connected to the substrate SUB. The outside O of the pillar can be constituted by channel semiconductor and the inside I of the pillar can be constituted by an insulation material such as silicon oxide.

The gate electrode layer of the memory block BLK can be connected to a ground select line GSL, a plurality of word lines WL1~WL8 and a string select line SSL. The pillar of the memory block BLK can be connected to a plurality of bit lines BL1~BL3. In FIG. 16, it is illustrated that one memory block BLK1 include two select lines (SSL, GSL) and eight word lines WL1∥WL8. However, at least some example embodiments of the inventive concepts may not be limited thereto.

Figure 17:
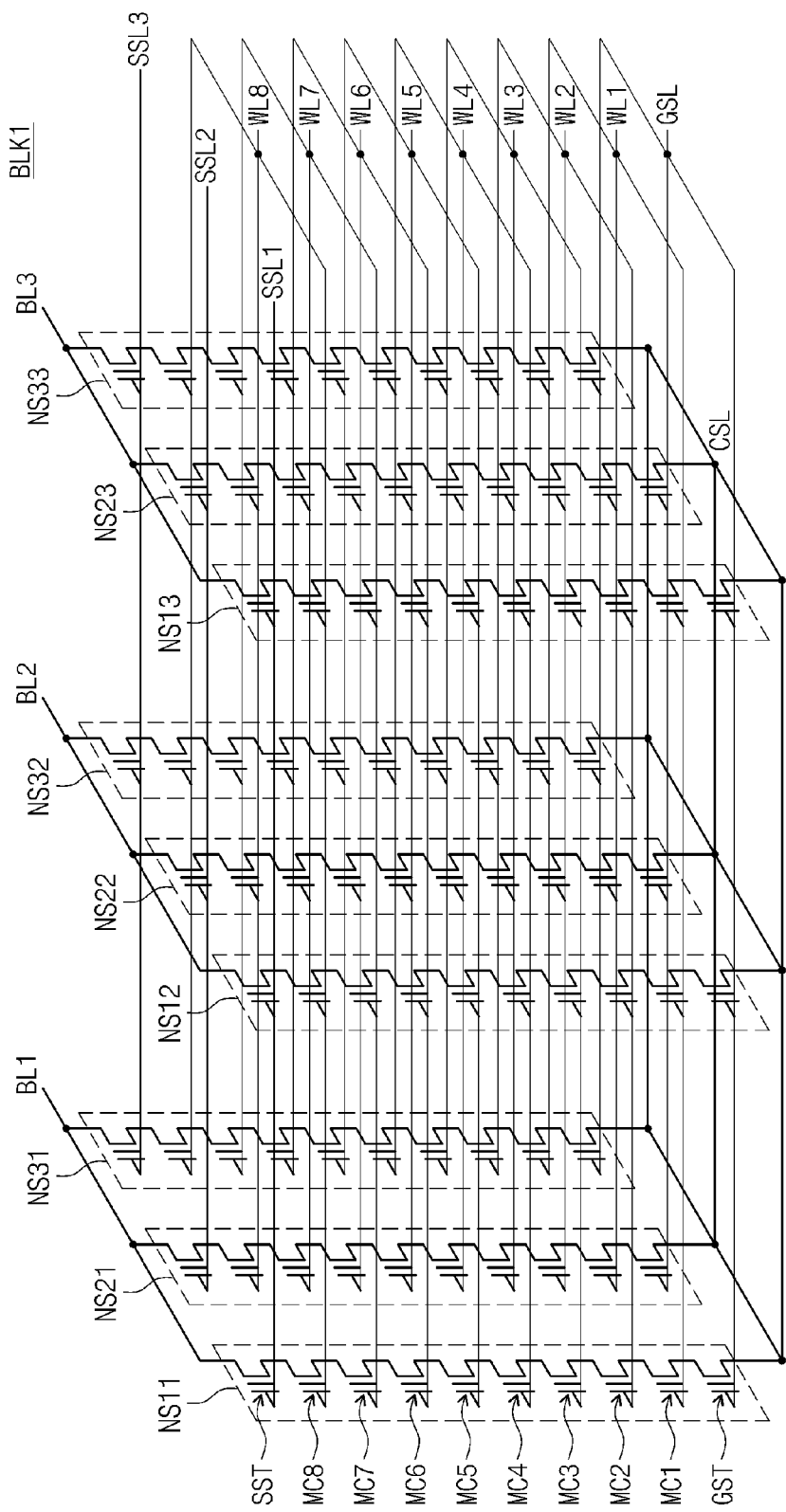

FIG. 17 is an equivalent circuit of the memory block illustrated in FIG. 16. Referring to FIG. 17, NAND strings NS11~NS33 are connected between bit lines BL1~BL3 and a common source CSL. Each NAND string includes a string select transistor SST, a plurality of memory cells MC1~MC8 and a ground select transistor GST.

The string select transistors SST are connected to respective string select lines SSL1~SSL3. The memory cells MC1∥MC8 are connected to respective word lines WL1~WL8. The ground select transistor GST is connected to a ground select line GSL. The string select transistor SST is connected to a bit line BL and the ground select transistor GST is connected to the common source line CSL.

Word lines (e.g., WL1) having a same level are connected in common to one another and the string select lines SSL1~SSL3 are separated from one another. In the case of programming a memory cell (hereinafter it is referred to as a page) that is connected to a first word line WL1 and belongs to the NAND strings NS11, NS12 and NS13, the first word line WL1 and the first select line SSL1 are selected.

According to at least some example embodiments of the inventive concepts, the nonvolatile memory system can determine a state of an upper page of a selected page. The nonvolatile memory system can lower an unselect read voltage being applied to a word line connected to the upper page according to a result of determination by a predetermined level. Accordingly, deterioration of memory cells included in the upper page is reduced and thereby a nonvolatile memory system having improved reliability and a method of operating the nonvolatile memory system are provided.

According to at least some example embodiments of the inventive concepts, a program state of an upper unselected word line adjacent to a selected word line can be determined and a voltage of the upper unselected word line can be controlled based on a result of determination. Thus, since read disturbance caused by a repetitive read operation can be reduced, a nonvolatile memory system having improved reliability and a method of operating the nonvolatile memory system are provided.

Example embodiments having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. An operating method of a memory controller controlling a nonvolatile memory device including a plurality of pages comprising:
   receiving a read request and a logical address from an additional device;
   determining a program state of an upper unselected word line of a selected word line corresponding to the received logical address; and
   transmitting a physical address corresponding to the logical address, state information, and a read command to the nonvolatile memory device according to a result of the determination in response to the read request,
   wherein the state information indicates a level of a first unselect read voltage the nonvolatile memory device is to apply to the upper unselected word line.

2. The operating method of claim 1, wherein
   the upper unselected word line is a word line located nearest a string select line among word lines adjacent to the selected word line, and
   the selected word line is a word line connected to a page corresponding to the received logical address.

3. The operating method of claim 2, further comprising:
   controlling the nonvolatile memory device to perform a read operation by applying the first unselect read voltage to the upper unselected word line, applying a second unselect read voltage to a lower unselected word line adjacent to the selected word line, applying a third unselect read voltage to unselected word lines other than the upper unselected word line and the lower unselected word line, and sequentially applying a plurality of select read voltages to the selected word line,
   wherein the first unselect read voltage is equal to or higher than the third unselect read voltage and lower than the second unselect read voltage.

4. The operating method of claim 2, further comprising:
   controlling the nonvolatile memory device to perform a read operation by applying the first unselect read voltage to unselected word lines located between the string select line and the selected word line, applying a second unselect read voltage to a lower unselected word line adjacent to the selected word line, applying a third unselect read voltage to word lines located between a ground select line and the selected word line among unselected word lines except the lower unselected word line, and sequentially applying a plurality of select read voltages to the selected word line,
   wherein the third unselect read voltage is higher than the first unselect read voltage and lower than the second unselect read voltage.

5. The operating method of claim 4, wherein controlling the nonvolatile memory device to perform a read operation includes controlling the nonvolatile memory device such that the first unselect read voltage has a level which is lower than at least one of the plurality of select read voltages.

6. The operating method of claim 4, wherein controlling the nonvolatile memory device to perform a read operation includes controlling the nonvolatile memory device such that the plurality of select read voltages are used as a verification read voltage for verifying a program result of the nonvolatile memory device.

7. The operating method of claim 1, wherein the determining a program state of an upper unselected word line of a selected word line corresponding to the received logical address comprises:
    determining whether the selected page corresponding to the received logical address is a most recently programmed page based on mapping information between the received logical address and the physical address of the nonvolatile memory device.

8. The operating method of claim 7, wherein the determining a program state of an upper unselected word line of a selected word line corresponding to the received logical address further comprises:
    judging that a state of the upper unselected word line is in an erase state if the selected page is the most recently programmed page.

9. The operating method of claim 7, wherein the mapping information is included in a flash translation layer being driven by the memory controller.

10. An operating method of a nonvolatile memory device including a plurality of pages and a memory circuit having information identifying a most recently programmed page among the plurality of pages comprising:
    receiving a read command and a physical address from a memory controller;
    determining a state of an upper unselected word line of a selected word line connected to a selected page corresponding to the received physical address by comparing the received physical address with the information identifying the most recently programmed page in the memory circuit;
    applying a first unselect read voltage to the upper unselected word line and sequentially applying a plurality of select read voltages to the selected word line based on a result of the determination in response to the read command;
    applying a second unselect read voltage to a lower unselected adjacent word line of the selected word line; and
    applying a third unselect read voltage to unselected word lines other that the lower unselected adjacent word line and the upper unselected adjacent word line,
    wherein the first unselect read voltage is lower than a second unselect read voltage, and is equal to or higher than a third unselect read voltage.

11. The operating method of claim 10, wherein the determining a state of an upper unselected word line of a selected word line connected to a selected page corresponding to the received physical address by comparing the received physical address with the information of the page programmed lastly stored in the memory circuit comprises:
    judging that the program state of the upper page is an erase state if the received physical address is included in information stored in the memory circuit; and
    judging that the program state of the upper page is a programmed state if the received physical address is not included in information stored in the memory circuit.

12. The operating method of claim 10, further comprising:
    reading out program states of memory cells connected to the selected word line on the basis of the plurality of select read voltages.

13. The operating method of claim 10, wherein the page information stored in the memory circuit is physical address information of the most recently programmed page.

14. The operating method of claim 13, wherein the nonvolatile memory device includes a plurality of memory blocks, and
    wherein the memory circuit comprises:
    the physical address information of the most recently programmed page of each of the memory blocks.

15. The operating method of claim 10, wherein the nonvolatile memory device is a NAND flash memory.

16. An operating method of a memory controller controlling a nonvolatile memory device including a plurality of word lines comprising:
    controlling the nonvolatile memory to perform a read operation by,
        selecting a word line, from among the plurality of word lines, to read, in accordance with a received address, and
        applying,
            one or more read select voltages to the selected word line,
            a first voltage to a first word line adjacent to the selected word line,
            a second voltage to a second word line, the second word line being different from the first word line and adjacent to the selected word line, and
            a third voltage to word lines, from among the plurality of word lines, other than the selected, first and second word lines, when the selected word line includes the most recently programmed page,
        the first and third voltages both being lower than the second voltage.

17. The method of claim 16, wherein the first word line is closer to a string select line of the nonvolatile memory device than the selected word line and the second word line.

18. The method of claim 16, wherein the applying the first voltage includes applying the first voltage such that the first voltage is lower than the one or more read select voltages.

19. The method of claim 16, wherein the applying the first voltage includes applying the first voltage such that the first voltage is equal to or higher than the third voltage.

20. The method of claim 19, wherein the applying the first voltage includes applying the first voltage such that the first voltage is higher than the third voltage.

* * * * *